(12) United States Patent
Saggio et al.

(10) Patent No.: US 7,892,923 B2
(45) Date of Patent: Feb. 22, 2011

(54) POWER FIELD EFFECT TRANSISTOR AND MANUFACTURING METHOD THEREOF

(75) Inventors: Mario Giuseppe Saggio, Acicastello (IT); Ferruccio Frisina, Sant'Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 509 days.

(21) Appl. No.: 11/971,111

(22) Filed: Jan. 8, 2008

(65) Prior Publication Data

US 2008/0185593 A1  Aug. 7, 2008

Related U.S. Application Data

(63) Continuation-in-part of application No. PCT/EP2006/006674, filed on Jul. 7, 2006.

(30) Foreign Application Priority Data

Jul. 8, 2005  (EP) ................... 05425496

(51) Int. Cl.
    *H01L 21/336* (2006.01)
(52) U.S. Cl. ............ 438/268; 438/301; 438/306; 438/514; 438/522; 438/527; 257/E21.066
(58) Field of Classification Search ............... 438/301, 438/306, 268, 514, 522, 527
    See application file for complete search history.

(56) References Cited

U.S. PATENT DOCUMENTS 5,510,281 A  4/1996 Ghezzo et al.
6,048,759 A  4/2000 Hshieh et al.
6,274,904 B1  8/2001 Tihanyi
2003/0207536 A1  11/2003 Miyasaka et al.
2004/0211980 A1  10/2004 Ryu

OTHER PUBLICATIONS

G. L. Harris, "Properties of Silicon Carbide," Aug. 1994, pp. 153-156, INSPEC, the Institution of Electrical Engineers, London, UK.
V. R. Vathulya et al., "Characterization of Inversion and Accumulation Layer Electron Transport in 4H and 6H-SiC MOSFETs on Impaired P-Type Regions," IEEE Transactions on Electron Devices, Nov. 2000, pp. 2018-2023, vol. 47, No. 11, IEEE, Piscataway, NJ, US.

*Primary Examiner*—Alexander G Ghyka
(74) *Attorney, Agent, or Firm*—Lisa K. Jorgenson; E. Russell Tarleton; Seed IP Law Group PLLC (57) ABSTRACT

A method of manufacturing a vertical power MOS transistor on a wide band gap semiconductor substrate having a wide band gap superficial semiconductor layer, including the steps of forming a screening structure on the superficial semiconductor layer that leaves a plurality of areas of the superficial semiconductor layer exposed, carrying out at least a first ion implantation of a first type of dopant in the superficial semiconductor layer for forming at least one deep implanted region, carrying out at least a second ion implantation of the first type of dopant in the superficial semiconductor layer for forming at least one implanted body region of the MOS transistor aligned with the deep implanted region, carrying out at least one ion implantation of a second type of dopant in the superficial semiconductor layer for forming at least an implanted source region of the MOS transistor inside the at least one implanted body region, and a low budget activation thermal process of the first and second dopant types suitable to complete the formation of the body region, of the source region, and of the deep implanted region with diffusing the dopants in the substrate.

23 Claims, 5 Drawing Sheets

POWER FIELD EFFECT TRANSISTOR AND MANUFACTURING METHOD THEREOF

BACKGROUND

1. Technical Field

The present disclosure relates to a method for manufacturing electronic devices integrated on a semiconductor substrate and corresponding devices, and to a method for manufacturing a power MOS transistor of the vertical type on a semiconductor substrate with wide band gap comprising a superficial semiconductor layer with wide band gap.

The disclosure also relates to a power MOSFET device integrated on a wide band gap semiconductor substrate, and to vertical high voltage power MOS transistors of the multi-drain type and the following description is made with reference to this field of application by way of illustration only.

2. Description of the Related Art

As is well known, silicon carbide (SiC) is a wide band gap semiconductor material, i.e., with an energetic value Eg of the band gap higher than 1.1 eV, with such physical characteristics as to make it ideal for the formation of electronic switches for power applications. In the following table some physical parameters are reported of the most common silicon carbide polytypes, in comparison with silicon (Si).

|  | Si | 3C-SiC | 6H-SiC | 4H-SiC |
|---|---|---|---|---|
| Eg (eV) | 1.1 | 2.3 | 3 | 3.3 |
| Vsn | $1 \times 10^7$ | $2.5 \times 10^7$ | $2 \times 10^7$ | $2 \times 10^7$ |
| μn (cm$^2$/Vs) | 1350 | 1000 | 380 | 947 |
| ∈r | 11.8 | 9.66 | 9.7 | 9.7 |
| Ec (V/cm) | $2 \times 10^5$ | $3 \times 10^6$ | $4 \times 10^6$ | $3 \times 10^6$ |
| K (W/cm K) | 1.5 | 4.9 | 5 | 5 | where Eg is the energetic value of the band gap, Vsn is the saturation speed of the electrons, μn is the mobility of the electrons, ∈r is the dielectric constant, Ec is the critical electric field, and k is the thermal conductivity.

From the parameters reported in such table, it is possible to deduce that power electronic devices formed on silicon carbide substrates as compared to power electronic devices formed on silicon substrates exhibit the following advantageous characteristics:

- a low output resistance in conduction being the breakdown voltage equal (due to the high critical electric field value Ec);
- a low leakage current (due to the high band gap energetic value, Eg),
- high working temperature and high working frequencies (due to the high thermal conductivity k and saturation speed Vns values).

It is to be noted that due to the high value of the critical electric field Ec in silicon carbide semiconductor substrates with respect to silicon semiconductor substrates, it is possible to form power devices integrated on silicon carbide semiconductor substrates that can withstand high cut-off voltages with a very reduced epitaxial thickness.

Figure 1:
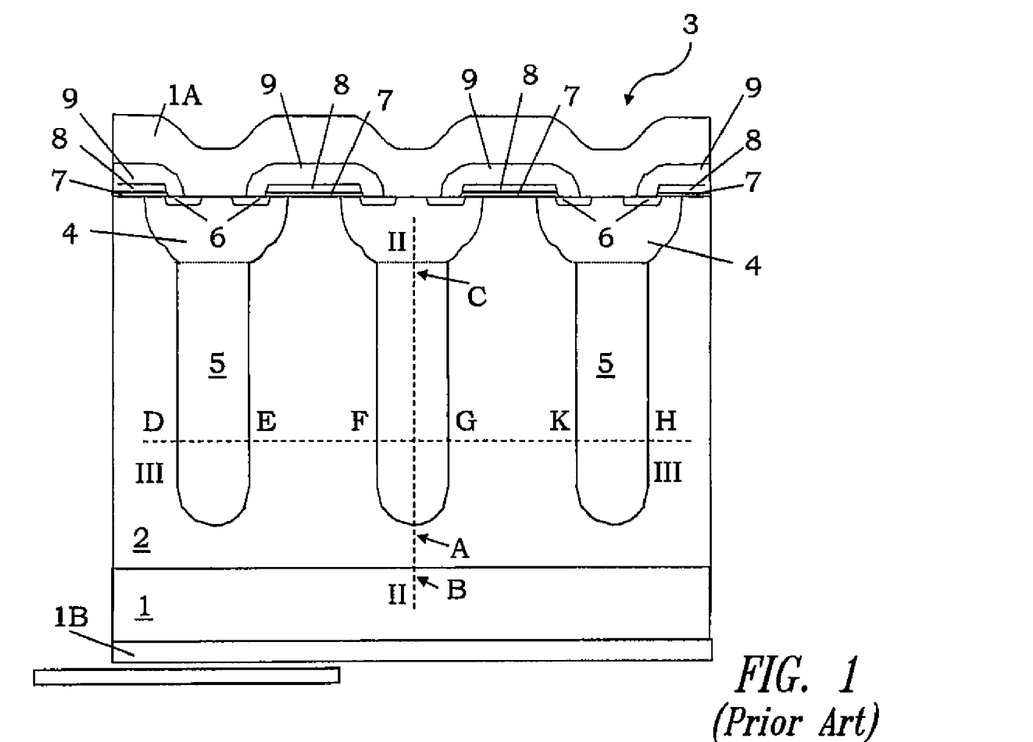
FIG. 1 shows a vertical section of a power MOSFET transistor integrated in a semiconductor substrate, formed according to the prior art.

For example, with reference to FIG. 1, a multi-drain MOS power device 3 of the known type is described which comprises a heavily doped silicon semiconductor substrate 1 of the N+ type, whereon a semiconductor epitaxial layer 2 is formed of the same N type.

The epitaxial layer 2 forms a common drain layer for a plurality of elementary units forming the MOS power device 3. Each elementary unit comprises a body region 4 of the P type formed in the epitaxial layer 2.

In the epitaxial layer 2, below each body region 4, there is a column region 5 of the P type which extends downwards for the whole thickness of the epitaxial layer 2 towards the semiconductor substrate 1.

In particular, each column region 5 is aligned and in contact with a respective body region 4.

The MOS power device 3 also exhibits, outside the body regions 4, heavily doped source regions 6 of the N type.

The surface of the epitaxial layer 2 is thus covered with a thin gate oxide layer 7 and with a polysilicon layer 8. Openings are thus provided in the polysilicon layer 8 and in the thin gate oxide layer 7 to uncover the surface of the epitaxial layer 2 in correspondence with each source region 6. An insulating layer 9 completely covers the polysilicon layer 8 and it partially covers the source regions 6, so as to enable a source metallic layer 1A to contact the source regions 6 and the body regions 4. A drain metallic layer 1B is also provided on the lower substrate of the semiconductor substrate 1.

To form a device 3 able to withstand a breakdown voltage BV equal to 600 V, a drain epitaxial layer 2 is to be provided formed in silicon and with a thickness equal to 60 mm and concentration equal to $2 \times 10^{14}$ at/cm$^3$. If the drain epitaxial layer 2 is instead formed in silicon carbide, it can have a thickness of only 4 mm and concentration equal to $1 \times 10^{16}$ at/cm$^3$, thus obtaining a much more compact device 3.

Moreover in these devices 3 of the multi-drain type, the presence thus of the column regions 5 allows to reduce the resistivity of the epitaxial layer 2 without decreasing the breakdown voltage BV of the device 3. With this type of device 3 it is thus possible to reach a predetermined breakdown voltage BV with a resistivity of the epitaxial layer 2 lower than that used in conventional MOSFET devices, and, in consequence, to obtain power MOSFET transistors with reduced output resistance Ron.

Figure 2:
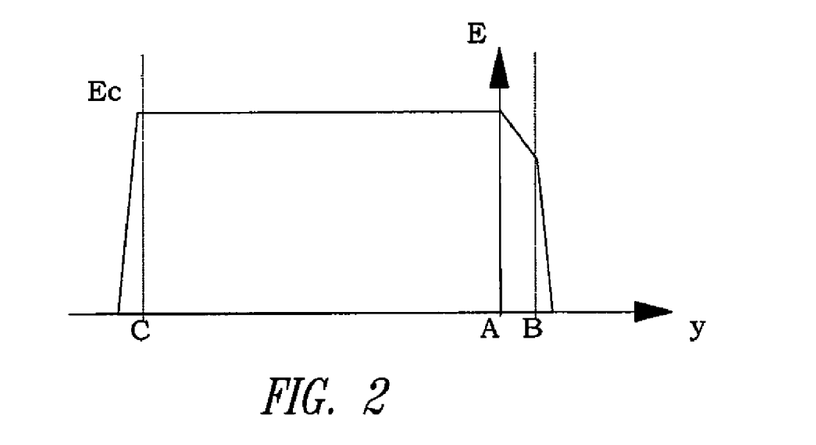
FIG. 2 shows the electric field trend along a section II-II of the device of FIG. 1.
Figure 3:
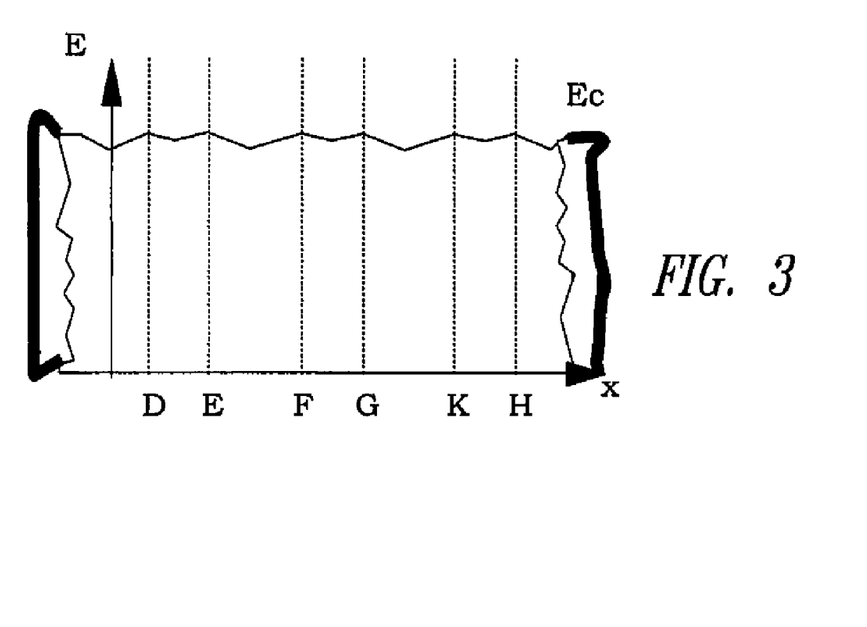
FIG. 3 shows the electric field trend along a section III-III of the device of FIG. 1.

As shown in FIGS. 2 and 3 the electric field E in the column region 5 of type and along the drain epitaxial layer 2 the electric field Ec is substantially constant. In particular, it verifies that the electric field E inside the device 3 exhibits the trend shown in FIG. 2, with reference to line II-II of FIG. 1. It thus results that the electric field trend is constant and equal to the critical electric field value in correspondence with a longitudinal dimension of the column region 5 (points A and C of FIGS. 1 and 2).

Similarly it is verified that such critical electric field Ec trend is constant and equal to the critical electric field value in correspondence with line III-III of FIG. 1, i.e., in correspondence with a transversal dimension of the device 3, both of the column regions 5, and in the drain epitaxial layer 2, this allows to obtain, being the drain layer thickness identical, a much higher breakdown voltage BV with respect to a MOS device not exhibiting the column region 5.

Moreover, it is known that the output resistance Ron is proportional to the resistivity $\rho_{epi}$ and to the thickness $th_{epi}$ of the epitaxial layer 2 while it is inversely proportional to the conduction area $A_{cond}$, which, for multi-drain transistors, is equal to the active area of the device 3 decreased of the area occupied by the column regions 5.

These three parameters, and in particular the resistivity $\rho_{epi}$, in multi-drain devices 3 are lower with respect to those of conventional power devices. Therefore, the output resistance Ron of these devices 3 of the multi-drain type is lower than that of conventional power devices.

Moreover, it is well known that for forming any electronic device integrated on a silicon carbide substrate it is necessary to introduce dopant elements which produce, inside the lattice matrix of the silicon carbide substrate, doped regions of the N or P type.

In particular, nitrogen (N) and phosphorus (P) introduce donors into the lattice matrix forming doped regions of the N type, boron (B) and aluminum (Al) introduce acceptors and form doped regions of the P type.

A particularly important technological problem linked to the formation of such doped regions is that any type of dopant implanted into a silicon carbide substrate has negligible diffusion coefficient D up to temperatures in the order of 1800° C. as described in the article "Properties of Silicon Carbide" by Gary L. Harris.

In particular, at such high temperatures, nitrogen has a diffusion coefficient D in the silicon carbide equal to $5 \times 10^{-12}$ $cm^2 s^{-1}$, oxygen has a diffusion coefficient D equal to $1.5 \times 10^{-16} cm^2 s^{-1}$, while boron has a diffusion coefficient D equal to $2.5 \times 10^{-13} cm^2 s^{-1}$.

In silicon, boron has a diffusion coefficient D equal to $2.5 \times 10^{-13} cm^2 s^{-1}$ at a temperature of about 1150° C. and thus it approximately has the same diffusion with respect to a silicon carbide substrate at a much lower temperature.

The diffusion of dopant species used for forming the doped regions necessary for the formation of power electronic devices is thus a problematic technical factor in case silicon carbide substrates are used.

Figure 4:
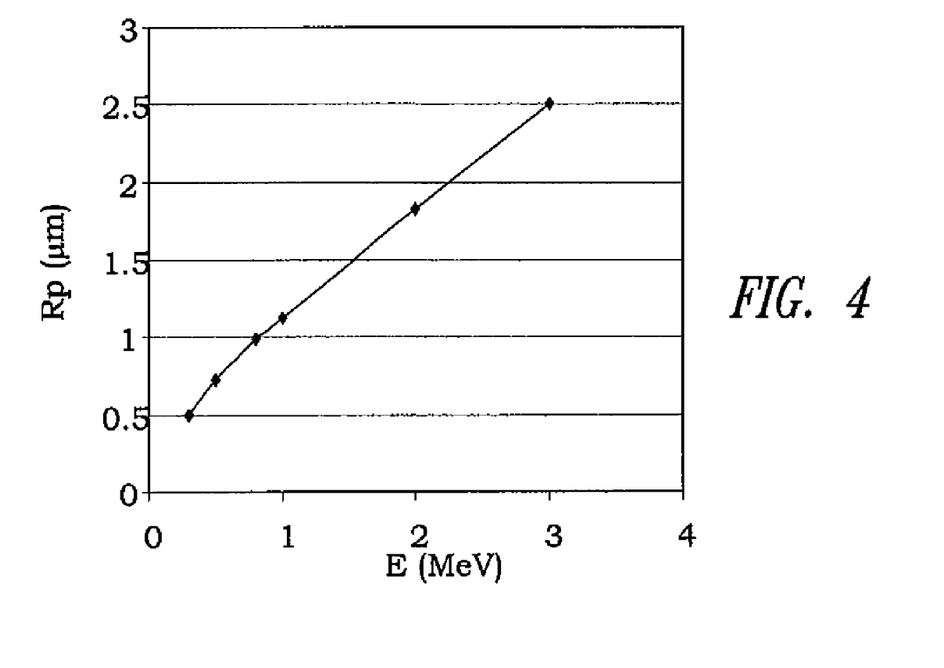
FIG. 4 shows the trend of the range projected by the boron ions in a silicon carbide semiconductor substrate when the implant energy varies.

Finally, analyses carried out by the Applicant have highlighted that the range projected by the boron into the silicon carbide, i.e., the typical distance covered by the boron inside the silicon carbide for a determined implantation energy, increases almost linearly with the implant energy, as shown in FIG. 4.

The technical problem underlying the present disclosure is that of devising a method for forming a power device integrated on a silicon carbide semiconductor substrate, having such structural characteristics as to allow to obtain electronic devices with very contained dimensions and exhibiting a very low output voltage, overcoming the limits and the drawback still affecting the devices formed according to known methods.

BRIEF SUMMARY

The solution idea underlying the present disclosure is that of manufacturing a power MOS transistor integrated on a wide band gap semiconductor substrate having body regions below which column regions are formed, uniquely defined by means of a series of ion implantations of suitable dopant species with different energy, so as to obtain power MOS transistors that, with the semiconductor substrate thickness identical, succeed in withstanding a high breakdown voltage BV.

In particular, such regions of the MOS transistor device are defined, in depth and concentration, by localizing dopant elements in the semiconductor substrate by means of suitable ionic implants and without making use of diffusion thermal processes.

On the basis of such a solution, the technical problem is solved by a method that includes the steps of forming a screening structure on said superficial semiconductor layer that leaves a plurality of areas of said superficial semiconductor layer exposed, carrying out a plurality of ion implantation steps of the first type of dopant in said superficial semiconductor substrate, through said screening structure, to form a plurality of deep implanted regions; carrying out at least a second ion implantation of the first type of dopant in said superficial semiconductor layer for forming at least one implanted body region of said MOS transistor aligned with said deep implanted regions, carrying out at least one ion implantation of a second type of dopant in said superficial semiconductor layer for forming at least an implanted source region of said MOS transistor inside said at least an implanted body region, and said method including an activation thermal process at temperatures lower than 1600° C. of the first type and second type of dopant suitable to complete said formation of said at least one body region, of said at least one source region and of said deep implanted regions.

The problem is also solved by a device as previously indicated and defined by a power MOSFET device integrated on a wide band gap semiconductor substrate, able to withstand a breakdown voltage BV higher than 600 V, including at least an implanted body region of a first type of conductivity in said substrate, at least an implanted source region of a second type of conductivity formed inside said at least one implanted body region, a gate region projecting from said substrate and insulated therefrom by means of a dielectric layer, a plurality of deep doped regions formed in said semiconductor substrate below said implanted body region, and wherein said implanted regions are obtained only by means of successive implantation steps and an activation thermal process.

In accordance with another embodiment of the present disclosure, a method is provided, the method including the steps of forming a screening structure on a wide band gap superficial semiconductor layer formed on a wide band gap semiconductor substrate to leave a plurality of exposed areas on the superficial semiconductor layer; forming a plurality of deep implanted regions in the superficial semiconductor substrate by ion implantation of a first type of dopant; forming at least one implanted body region of a MOS transistor by a second ion implantation of the first type of dopant in the superficial semiconductor layer so that at least one implanted body region is aligned with the deep implanted regions; forming at least an implanted source region inside the implanted body region by ion implantation of a second type of dopant in the superficial semiconductor layer; and applying a temperature lower than 1600° C. to the first type of dopant and the second type of dopant to complete formation of the body region, the source region, and the deep implanted region without diffusing of the first and second type of dopants in the superficial semiconductor layer and the semiconductor substrate.

In accordance with another aspect of the foregoing embodiment, the temperature is in the range of 1400° C. to 1600° C. Ideally, the temperature is applied for a period in the range of 15 minutes to 5 hours.

BRIEF DESCRIPTION OF THE SEVERAL VIEWS OF THE DRAWINGS

The characteristics and the advantages of the method and of the device according to the disclosure will be apparent from the following description of an embodiments thereof made by way of indicative and non limiting example with reference to the annexed drawings, in which.

DETAILED DESCRIPTION

With reference to such figures, a method is described for manufacturing electronic devices integrated in a semiconductor substrate.

The method steps hereafter described do not form a complete flow of the process for the manufacturing of integrated circuits. The present disclosure can be put into practice together with the techniques for manufacturing integrated circuits currently used in the field, and only those commonly used process steps being necessary for the comprehension of the present disclosure are included in the description.

The figures showing transversal sections of an integrated electronic device portions during the manufacturing are not drawn to scale, but they are instead drawn so as to show the important characteristics of the disclosure.

Figure 5:
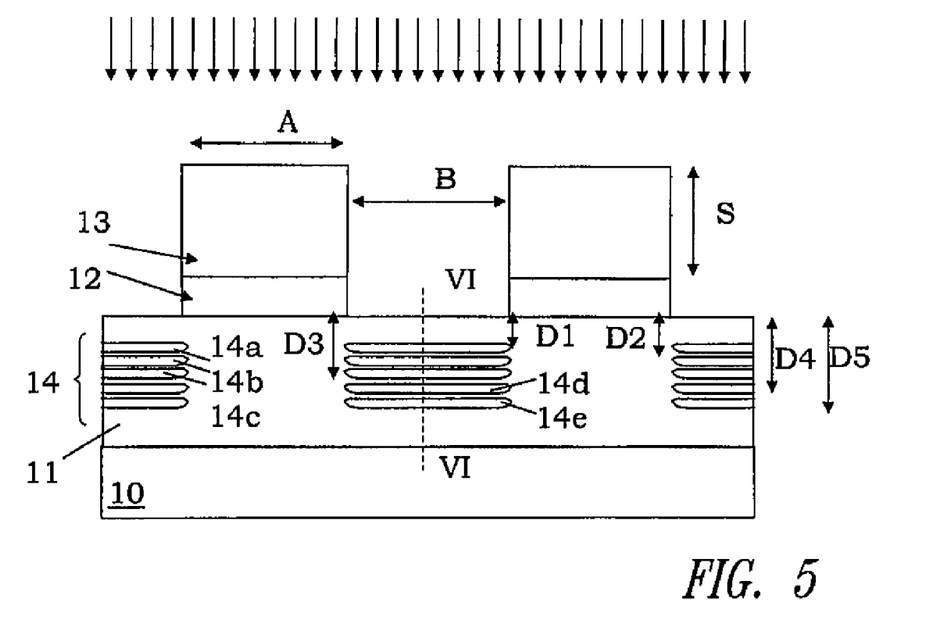
FIGS. 5 and 7-11 show vertical sections of a MOSFET transistor during different manufacturing steps of the method according to the present disclosure.

With reference to FIGS. 5 and from 7 to 11, an embodiment of the method according to the present disclosure for manufacturing a vertical power MOSFET transistor is shown.

On a wide band gap semiconductor substrate 10, for example of silicon carbide 4H of the N type, a wide band gap superficial semiconductor layer 11 is formed, for example an epitaxial layer of silicon carbide of the N type but with a greater concentration with respect to the semiconductor substrate 10, whereon, in a conventional way, edge structures are formed not shown in the figures. Advantageously, the thickness of the semiconductor substrate 11 is such that the final device can withstand a breakdown voltage equal to 600 V. For example, the thickness of the semiconductor layer 11 is equal to 4 µm.

On the epitaxial layer 11, a first dielectric layer 12 is formed, for example by means of deposition of about 5000 Å of TEOS, or growth of a thin silicon oxide layer followed by a deposition of silicon nitride of about 1000 Å and by one of TEOS of about 5000 Å. By means of a photolithographic process including the use of a resist mask 13, elementary strips are defined in the resist mask 13 with a thickness S for example equal to 4 µm. As shown in FIG. 5, the dielectric layer 12 is selectively etched for forming thick dielectric strips of width A, spaced from one another by a distance B, always indicated with 12. The width A is for example comprised between 4 and 6 µm, and the distance B is for example equal to 4 µm. Such strips 12 act as a screening structure for portions of the epitaxial layer 11 during successive implantation steps.

Nothing forbids the areas of the semiconductor layer 11 left exposed by the dielectric strips 12 from having a different shape with respect to those of the elementary strips, such as a polygonal shape or other suitable shape.

Column regions 14 are then formed, being implanted in the semiconductor layer 11 by means of a series of ion implantations followed by a single low budget activation thermal process suitable to complete the formation of these implanted regions. In other words this activation process is not made to be followed by any other thermal process allowing the diffusion of the dopant species implanted into the semiconductor layer 11.

As shown in FIG. 5, such series of ion implantations are carried out through a same mask, in particular, the screening structure 12. For example, a series of five ion implantations is carried out by means of a respective dose of P dopant, so as to form a plurality of deep implanted regions 14a, 14b, 14c, 14d, 14e aligned with each other in the epitaxial layer 11 and each formed at a different distance of the epitaxial layer 11 surface.

In particular, the first implanted region 14a is formed at a distance D1, for example equal to 0.5 µm, from the surface of the epitaxial layer 11, the second implanted region 14b is formed at a distance D2, for example equal to 1 µm, from the surface of the epitaxial layer 11, the third implanted region 14c is formed at a distance D3, for example equal to 1.5 µm, from the surface of the epitaxial layer 11, the fourth implanted region 14d is formed at a distance D4, for example equal to 2 µm, from the surface of the epitaxial layer 11, while the fifth and last implanted region 14e is formed at a distance D5, for example equal to 2.5 µm, from the surface of the epitaxial layer 11.

Advantageously, each one of these deep implanted regions 14a, 14b, 14c, 14d, 14e is formed both with a growing implant dose and with a growing implantation energy. For example, the first implanted region 14a is formed with a first implant dose and with a first implantation energy value; the second implanted region 14b being deeper than the first implanted region 14a is formed with a second implant dose being greater than the first implant dose and with a second implantation energy value being greater than the first implantation energy value; the third implanted region 14c being deeper than the second implanted region 14b is formed with a third implant dose being greater than the second implant dose and with a third implantation energy value being greater than the second implantation energy value; the fourth implanted region 14d being deeper than the third implanted region 14c is formed with a fourth implant dose being greater than the third implant dose and with a fourth implantation energy value being greater than the third implantation energy value; the fourth implanted region 14d being deeper than the third implanted region 14c is formed with a fourth implant dose being greater than the third implant dose and with a fourth implantation energy value being greater than the third implantation energy value; and finally the fifth implanted region 14e being deeper than the fourth implanted region 14d is formed with a fifth implant dose being greater than the fourth implant dose and with a fifth implantation energy value being greater than the fourth implantation energy value.

Figure 6:
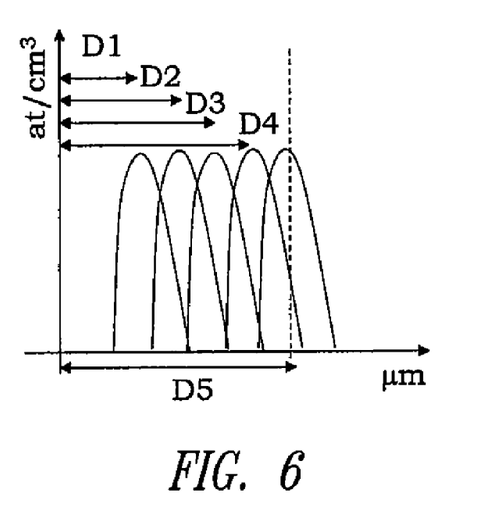
FIG. 6 shows the trend of the dopant concentration along a section VI-VI of the device of FIG. 5.

Moreover, as shown in FIG. 6, for each implanted region the dopant is Gaussian-like distributed in the epitaxial layer 11, the center of each of these Gaussian distributions corresponding to the distances D1-D5 of the deep implanted regions 14a-14e. Therefore, the implanted regions 14a-14e thus obtained are in electric contact with one another.

Each of these ion implantations for forming these deep implanted regions 14a, 14b, 14c, 14d, 14e is carried out, for example, with boron or aluminum ions, with a concentration that varies between, i.e., in the range of, $1 \times 10^{14}$ at/cm$^2$ and $1 \times 10^{16}$ at/cm$^2$ and an implant energy ranging from 300 keV to 3 MeV.

Figure 7:
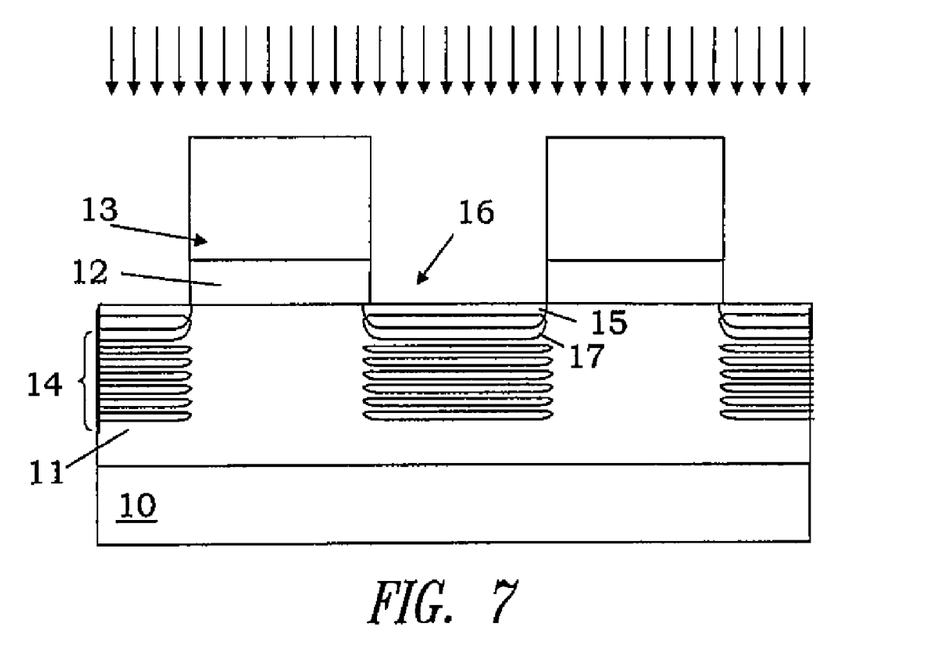

The process according to present disclosure continues with the manufacturing of a vertical power MOS transistor, for example as shown in FIG. 7. Thus, a first ion implantation, in particular of the P type, is done, suitable to form a first portion 15 of a body well 16 for the formation of a channel region aligned with the deep implanted regions 14a, 14b, 14c, 14d, 14e.

Such first ion implantation is carried out for example with boron or aluminum ions and with a concentration that varies in the range of $1 \times 10^{13}$ at/cm$^2$ and $1 \times 10^{14}$ at/cm$^2$ and an implant energy in the range of 30-80 keV.

At this point, a second ion implantation of the P type is carried out suitable to form a second deep portion 17 of the body well 16 to withstand the electric field during the cut-off step and to reduce the gain of parasite transistors that are formed in the semiconductor layer 11. Such second ion implantation of the P type is carried out for example with boron or aluminum ions with a concentration that varies in the range of $5\times10^{13}$ at/cm$^2$ and $5\times10^{14}$ at/cm$^2$ and an implant energy in the range of 300-500 keV.

Advantageously, also in the body well 16 the dopant is Gaussian-like distributed into the semiconductor substrate 11, and thus such body well 16 is in electric contact with at least one of the deep implanted regions 14a-14e.

Once the resist mask 13 is removed, a deposition or growth step is advantageously carried out of a stopping layer for the successive etching, for example 50-500 Å of silicon oxide or nitride, not shown in the figures.

Figure 8:
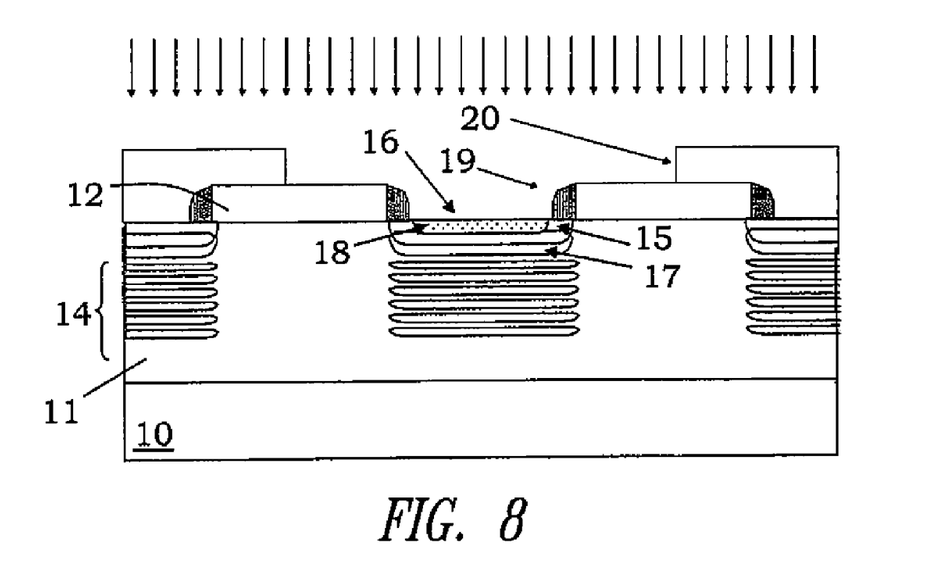

A sacrificial layer of suitable thickness is thus deposited for the formation of implant spacers 19, for example polysilicon in the range of 3000-7000 Å, as shown in FIG. 8. It is to be noted that the thickness of the sacrificial layer determines the channel length of the MOS device, as will be clear hereafter.

An etching step is then formed, for example of the dry type, of the sacrificial layer to form spacers 19 on the side walls of the thick dielectric strips 12.

By means of a photolithographic process, which includes the use of a second resist mask 20, the whole epitaxial layer 11 is covered except for areas aligned to the portions of the epitaxial layer 11 wherein source regions will be formed.

A first ion implantation step is carried out, in particular of the N type, suitable to form a source region 18. Such first ion implantation is carried out for example with phosphorus, nitrogen or aluminum ions with a concentration that varies in the range of $5\times10^{14}$ at/cm$^2$ and $5\times10^{15}$ at/cm$^2$ and an implant energy in the range of 30-80 keV.

Once a removal step of the implant spacers 19 is carried out, for example in wet, in particular by dipping into a solution of KOH, advantageously, according to the disclosure, a single activation thermal process is carried out of the dopant species for completing the implanted regions 14, 15, 17 and 18.

Such activation thermal process is carried out at a temperature, for example, in the range of 1400° C. and 1600° C. for a time in the range of 15 min and 5 hours. It is to be noted the fact that such activation thermal process is carried out so as to allow only the activation and not the diffusion of the dopant species, and thus it is a low thermal budget process, i.e., a low temperature process.

An etching and removal step of the stopping layer, if previously formed, is then carried out.

Figure 9:
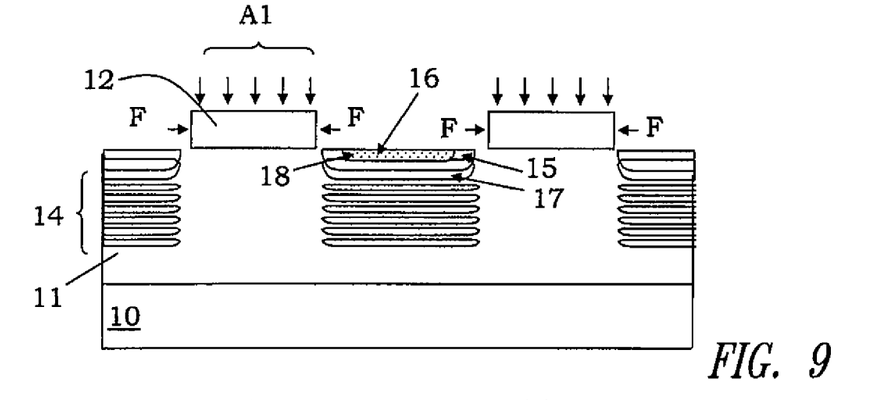

Advantageously, the method thus includes an etching step, for example of the timed wet type, of the thick dielectric strips 12 so as to reduce their width from A to A1 and thus make them go back or reduce in size with respect to the body well 16, as shown in FIG. 9.

Figure 10:
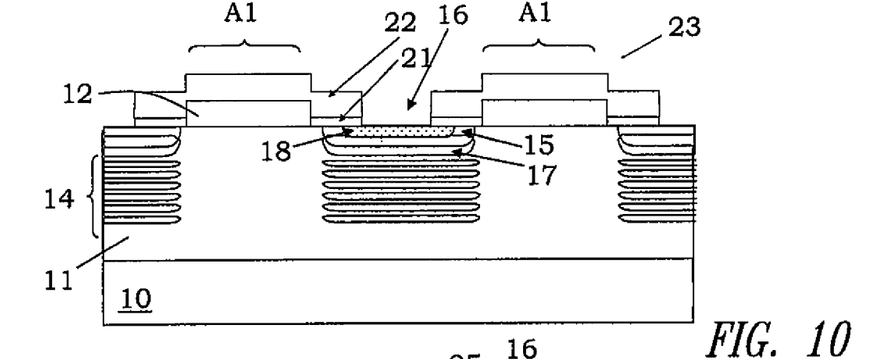
Figure 11:
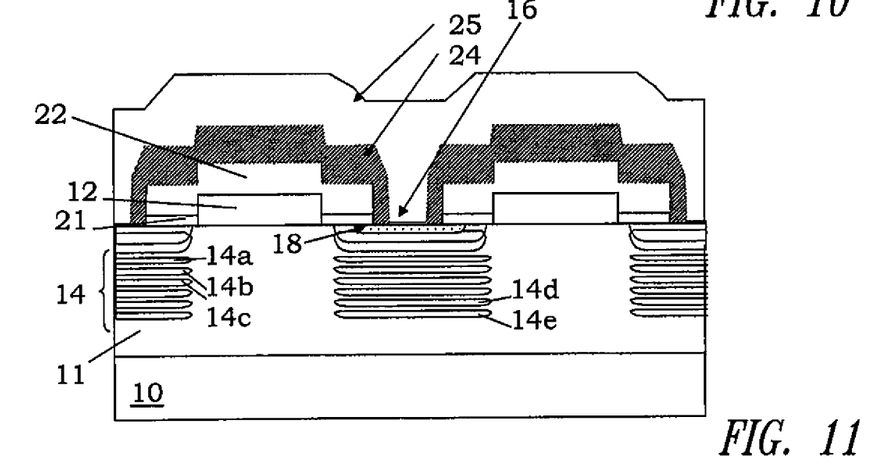

Once a cleaning step of the surface of the device thus obtained is carried out, a thin dielectric layer 21 is formed on the whole device, for example a silicon oxide layer followed by a deposition in the range of 500-1000 Å of TEOS, as shown in FIG. 10.

A conductive layer 22 is then formed, for example of suitably doped polysilicon, for the formation of gate regions 23.

By means of a photolithographic process, which includes the use of a third resist mask, a successive etching step of the conductive layer 22 and of the dielectric layer 21 a gate loop 23 is thus defined, as shown in FIG. 10, so that the gate regions 23 are partially overlapped onto the body wells 16 and insulated therefrom by means of the thin dielectric layer 21 and are thus substantially aligned with the source regions 18.

In such a way, in the final device, the gate regions 23 are insulated from the semiconductor layer 11 by means of a dielectric layer 12, 21 which includes a first portion formed by the strips 12 having a first thickness and a second portion formed by the dielectric layer 21 of a second thickness lower than the first thickness.

The device is then completed, as shown in FIG. 10, by means of conventional process steps, which include:
 a covering step with a dielectric layer 24 wherein openings are formed for the contacts;
 a formation step of a metallization and finishing layer 25 of the substrate 10 back.

Although in the description reference has been made to silicon carbide semiconductor layers, the method according to the present disclosure can be validly used for forming power MOS devices integrated on semiconductor substrates formed in wide band gap semiconductor materials, i.e., with a band gap energetic value Eg greater than that of the silicon which is equal to 1.1 eV. In fact, such power MOS devices formed with wide band semiconductor materials can withstand a critical electric field Ec higher than $1\times10^6$ V/cm and thus a high breakdown voltage BV.

Therefore, such power MOS devices are also advantageously able to manage high voltages, still maintaining a thickness of the drain layer particularly contained.

In particular, the manufacturing method according to the present disclosure enables the formation of power MOS devices on a silicon carbide substrate able to withstand a higher breakdown voltage BV (higher than 600 V) with respect to that of the devices formed according to prior methods.

In conclusion, the device thus formed is a power MOS transistor of the multi-drain type that is compact and exhibits a very low output voltage, wherein the semiconductor layer 11 forms a common drain layer for a plurality of elementary units that form the final power MOS device. Each elementary unit includes a body well 16 below which the deep implanted regions 14a-14e are formed that realize the same characteristics of the column regions formed in the power transistors described with reference to the prior methods and to the final device.

The use of the implantation steps with growing energy levels permits the formation of column structures 14 that do not require a diffusion step of the dopant (which is a problematic step in the case of silicon carbide substrates), but simply a low thermal budget activation thermal process of the dopant of the N and P type.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a vertical power MOS transistor on a wide band gap semiconductor substrate able to withstand a breakdown voltage BV higher than 600 V, and having a wide band gap superficial semiconductor layer formed on the substrate, the method comprising the steps of:

forming a screening structure on a surface of the superficial semiconductor layer that leaves a plurality of areas of said superficial semiconductor layer exposed, carrying out a plurality of ion implantation steps of the first type of dopant in said superficial semiconductor substrate, through said screening structure, to form a plurality of deep implanted regions that terminate at a distance greater than 2.0 µm and no greater than 2.5 µm from the surface of the superficial semiconductor layer;

carrying out at least a second ion implantation of the first type of dopant in said superficial semiconductor layer to form at least one implanted body region of said MOS transistor aligned with said deep implanted regions, carrying out at least one ion implantation of a second type of dopant in said superficial semiconductor layer to form at least an implanted source region of said MOS transistor inside said at least an implanted body region, and said method comprising an activation thermal process at temperatures lower than 1600° C. of the first type and second type of dopant suitable to complete said formation of said at least one body region, of said at least one source region, and of said deep implanted regions.

2. The method according to claim 1 wherein each of said ion implantation steps of the first type of dopant is carried out with a growing implant energy.

3. The method according to claim 1 wherein each of said ion implantation steps of the second type of dopant is carried out with a growing implant dose.

4. The method according to claim 1 wherein at least a second ion implantation of the first type of dopant comprises at least a first implantation step for forming a first portion of said at least one implanted body region.

5. The method according to claim 4 wherein said at least a second ion implantation of the first type of dopant comprises at least a further implantation step for forming a second deeper portion with respect to said first portion of said at least one implanted body region.

6. The method according to claim 4 wherein said first ion implantation step for forming a first portion of said at least one implanted body region is formed with boron or aluminum ions with a concentration that varies in the range of $1 \times 10^{13}$ at/cm$^2$ and $1 \times 10^{14}$ at/cm$^2$ and an implant energy that varies in the range of 30 and 80 keV.

7. The method according to claim 5 wherein said at least a further implantation step is formed with boron or aluminum ions with a concentration that varies in the range of $5 \times 10^{13}$ at/cm$^2$ and $5 \times 10^{14}$ at/cm$^2$ and an implant energy that varies in the range of 300 and 500 keV.

8. The method according to claim 1 wherein said implantation steps of said first type of dopant are carried out with boron or aluminum ions, with a concentration that varies in the range of $1 \times 10^{14}$ at/cm$^2$ and $1 \times 10^{16}$ at/cm$^2$ and an implant energy in the range of 300 keV and 3 MeV.

9. The method according to claim 1, comprising forming spacers on side walls of said screening structure before carrying out said ion implantation of a second type of dopant.

10. The method according to claim 9, comprising the following steps:

carrying out an etching step of said screening structure so as to reduce its dimensions and make it go back with respect to said at least one implanted body region, forming, in cascade, a thin dielectric layer and a conductive layer, and forming gate regions, by means of a conventional photolithographic technique, by etching, in succession, said conductive layer and said thin dielectric layer so that said gate regions are partially overlapped onto said at least implanted body regions insulated from said at least implanted body regions by means of said thin dielectric layer, said gate regions substantially aligned with said at least one implanted source region.

11. The method according to claim 1 wherein before carrying out said ion implantation step of the second type of dopant, a mask is formed on said superficial semiconductor layer for screening a portion of said superficial semiconductor layer.

12. The method according to claim 1 wherein said semiconductor substrate and said superficial semiconductor layer are formed by silicon carbide layers.

13. The method according to claim 1 wherein said superficial semiconductor layer is grown epitaxially.

14. A method, comprising:

forming a screening structure on a surface of a wide band gap superficial semiconductor layer formed on a wide band gap semiconductor substrate to leave a plurality of exposed areas on the superficial semiconductor layer;

forming a plurality of deep implanted regions in the superficial semiconductor substrate by ion implantation of a first type of dopant that terminate at a distance greater than 2.0 µm and no greater than 2.5 µm from the surface of the superficial semiconductor layer;

forming at least one implanted body region of a MOS transistor by a second ion implantation of the first type of dopant in the superficial semiconductor layer so that at least one implanted body region is aligned with the deep implanted regions;

forming at least an implanted source region inside the implanted body region by ion implantation of a second type of dopant in the superficial semiconductor layer; and applying a temperature lower than 1600° C. to the first type of dopant and the second type of dopant to complete formation of the body region, the source region, and the deep implanted region without diffusing of the first and second type of dopants in the superficial semiconductor layer and the semiconductor substrate.

15. The method of claim 14 wherein the temperature is in the range of 1400° C. to 1600° C.

16. The method of claim 15 wherein the temperature is applied for a period in the range of 15 minutes to 5 hours.

17. A method of manufacturing a vertical power MOS transistor on a wide band gap semiconductor substrate able to withstand a breakdown voltage BV higher than 600 V, and having a wide band gap superficial semiconductor layer formed on the substrate, the method comprising the steps of:

forming a screening structure on said superficial semiconductor layer that leaves a plurality of areas of said superficial semiconductor layer exposed, carrying out a plurality of ion implantation steps of the first type of dopant in said superficial semiconductor substrate, through said screening structure, to form a plurality of deep implanted regions;

carrying out at least a second ion implantation of the first type of dopant in said superficial semiconductor layer for forming at least one implanted body region of said MOS transistor aligned with said deep implanted regions;

carrying out at least one ion implantation of a second type of dopant in said superficial semiconductor layer for forming at least an implanted source region of said MOS transistor inside said at least an implanted body region, and said method comprising an activation thermal process at temperatures lower than 1600° C. of the first type and second type of dopant suitable to complete said formation of said at least one body region, of said at least one source region and of said deep implanted regions;

forming spacers on side walls of said screening structure before carrying out said ion implantation of a second type of dopant;

carrying out an etching step of said screening structure so as to reduce its dimensions and make it go back with respect to said at least one implanted body region;

forming, in cascade, a thin dielectric layer and a conductive layer; and forming gate regions, by means of a conventional photolithographic technique, by etching, in succession, said conductive layer and said thin dielectric layer so that said gate regions are partially overlapped onto said at least implanted body regions insulated from said at least implanted body regions by means of said thin dielectric layer, said gate regions substantially aligned with said at least one implanted source region.

18. The method of claim 17 wherein the deeper implanted region is located at no more than 2.5 μm from the surface of said superficial semiconductor substrate.

19. The method of claim 17 wherein at least a second ion implantation of the first type of dopant comprises at least a first implantation step for forming a first portion of said at least one implanted body region.

20. The method of claim 19 wherein said at least a second ion implantation of the first type of dopant comprises at least a further implantation step for forming a second deeper portion with respect to said first portion of said at least one implanted body region.

21. The method of claim 20 wherein said first ion implantation step for forming a first portion of said at least one implanted body region is formed with boron or aluminum ions with a concentration that varies in the range of $1\times10^{13}$ at/cm$^2$ and $1\times10^{14}$ at/cm$^2$ and an implant energy that varies in the range of 30 and 80 keV.

22. The method of claim 17 wherein said implantation steps of said first type of dopant are carried out with boron or aluminum ions, with a concentration that varies in the range of $1\times10^{14}$ at/cm$^2$ and $1\times10^{16}$ at/cm$^2$ and an implant energy in the range of 300 keV and 3MeV.

23. The method of claim 17 wherein said semiconductor substrate and said superficial semiconductor layer are formed by silicon carbide layers.

* * * * *